US012787240B2

(12) United States Patent
Hamamoto et al.

(10) Patent No.: US 12,787,240 B2
(45) Date of Patent: Nov. 3, 2026

(54) WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Naoya Hamamoto, Yokkaichi (JP); Jisung Kim, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRONIC INDUSTRIES, LTD., Osaka (JP)

( * ) Notice: Subject to any disclaimer, the term of this patent is extended or adjusted under 35 U.S.C. 154(b) by 180 days.

(21) Appl. No.: 18/862,242

(22) PCT Filed: Apr. 13, 2023

(86) PCT No.: PCT/JP2023/015023
§ 371 (c)(1),
(2) Date: Nov. 1, 2024

(87) PCT Pub. No.: WO2023/214498
PCT Pub. Date: Nov. 9, 2023

(65) Prior Publication Data

US 2026/0197983 A1 Jul. 9, 2026

(30) Foreign Application Priority Data

May 2, 2022 (JP) ................................ 2022-076090

(51) Int. Cl.
*H02G 3/04* (2006.01)
*H01B 7/00* (2006.01)
*H05K 9/00* (2006.01)

(52) U.S. Cl.
CPC ......... *H05K 9/0098* (2013.01); *H01B 7/0045* (2013.01); *H02G 3/0462* (2013.01)

(58) Field of Classification Search
CPC ............... H02G 3/0462; H02G 3/0616; H01B 7/0045; H01B 5/12; H05K 9/0098;
(Continued)

(56) References Cited

U.S. PATENT DOCUMENTS 6,123,556 A 9/2000 Asakura et al.
2002/0164900 A1* 11/2002 Youtsey ............... H01R 9/0527 439/578
(Continued)

FOREIGN PATENT DOCUMENTS

JP H11-74004 A 3/1999
JP 2006-311699 A 11/2006
(Continued)

OTHER PUBLICATIONS

Jun. 20, 2023 International Search Report issued in International Patent Application No. PCT/JP2023/015023.

*Primary Examiner* — Roshn K Varghese
(74) *Attorney, Agent, or Firm* — Oliff PLC

(57) ABSTRACT

A wire harness including: a shielded wire that includes a core wire; an inner insulation coating that covers an outer periphery of the core wire; a shield that covers an outer periphery of the inner insulation coating; and an outer insulation coating that covers an outer periphery of the shield; and a metal pipe through which the core wire and the inner insulation coating extend and to which the shield is connected, wherein: the shield has a connection section
(Continued)

connected to an outer circumferential face of the metal pipe while being covered by the outer insulation coating, and the outer insulation coating has an intimate contact section that extends further from the connection section and in intimate contact over an entire perimeter with the outer circumferential face of the metal pipe.

8 Claims, 4 Drawing Sheets

(58) Field of Classification Search
CPC ................ H01R 9/0518; H01R 9/0524; H01R 13/5808; H01R 13/6581; H01R 4/183; H01R 4/20; H01R 4/72
See application file for complete search history.

(56) References Cited

U.S. PATENT DOCUMENTS

| | | | |
|---|---|---|---|
| 2015/0075862 | A1 | 3/2015 | Oka et al. |
| 2018/0122532 | A1 | 5/2018 | Kushima et al. |
| 2023/0017633 | A1 | 1/2023 | Kim et al. |

FOREIGN PATENT DOCUMENTS

| | | | |
|---|---|---|---|
| JP | 2012-175879 | A | 9/2012 |
| JP | 2015-060747 | A | 3/2015 |
| JP | 2021-097585 | A | 6/2021 |
| WO | 2016/171204 | A1 | 10/2016 |

* cited by examiner

WIRE HARNESS

BACKGROUND

The present disclosure relates to a wire harness.

Conventional wire harnesses may include an electric wire having a core wire and an insulating coating that covers the outer periphery of the core wire, a metal pipe through which the electric wire extends, and a waterproofing member such as a rubber plug interposed between the electric wire and the metal pipe (e.g., see JP 2021-97585A). In such wire harnesses, the metal pipe can waterproof the interior of the metal pipe. Other types of wire harnesses may include a shielding member made of a braided wire or the like that covers the outer periphery of the electric wire, and an outer insulating coating that covers the outer periphery of the shielding member. Some types of shielding members may have, for example, an end portion exposed from the outer insulating coating and crimped and fixed to the outer periphery of the metal pipe using a crimping member. In such wire harnesses, a connection section between the shielding member and the metal pipe is covered by, for example, a cylindrical waterproofing member called a rubber boot. The rubber boot covers the connection section and is fixed at two ends by cable ties. This suppresses electromagnetic radiation from the core wire and also waterproofs the shielding member and the interior of the metal pipe.

SUMMARY

However, the aforementioned wire harnesses require a rubber boot to waterproof the shielding member and the interior of the metal pipe. There is a need for a simpler configuration of such wire harnesses.

An exemplary aspect of the disclosure provides a wire harness that allows for a simpler configuration.

A wire harness of the present disclosure is a wire harness including: a shielded wire that includes a core wire; an inner insulation coating that covers an outer periphery of the core wire; a shield that covers an outer periphery of the inner insulation coating; and an outer insulation coating that covers an outer periphery of the shield; and a metal pipe through which the core wire and the inner insulation coating extend and to which the shield is connected, wherein: the shield has a connection section connected to an outer circumferential face of the metal pipe while being covered by the outer insulation coating, and the outer insulation coating has an intimate contact section that extends further from the connection section and in intimate contact over an entire perimeter with the outer circumferential face of the metal pipe.

According to the present disclosure, a wire harness that allows for a simpler configuration can be provided.

DETAILED DESCRIPTION OF EMBODIMENTS

Description of Embodiments of Present Disclosure

Figure 1:
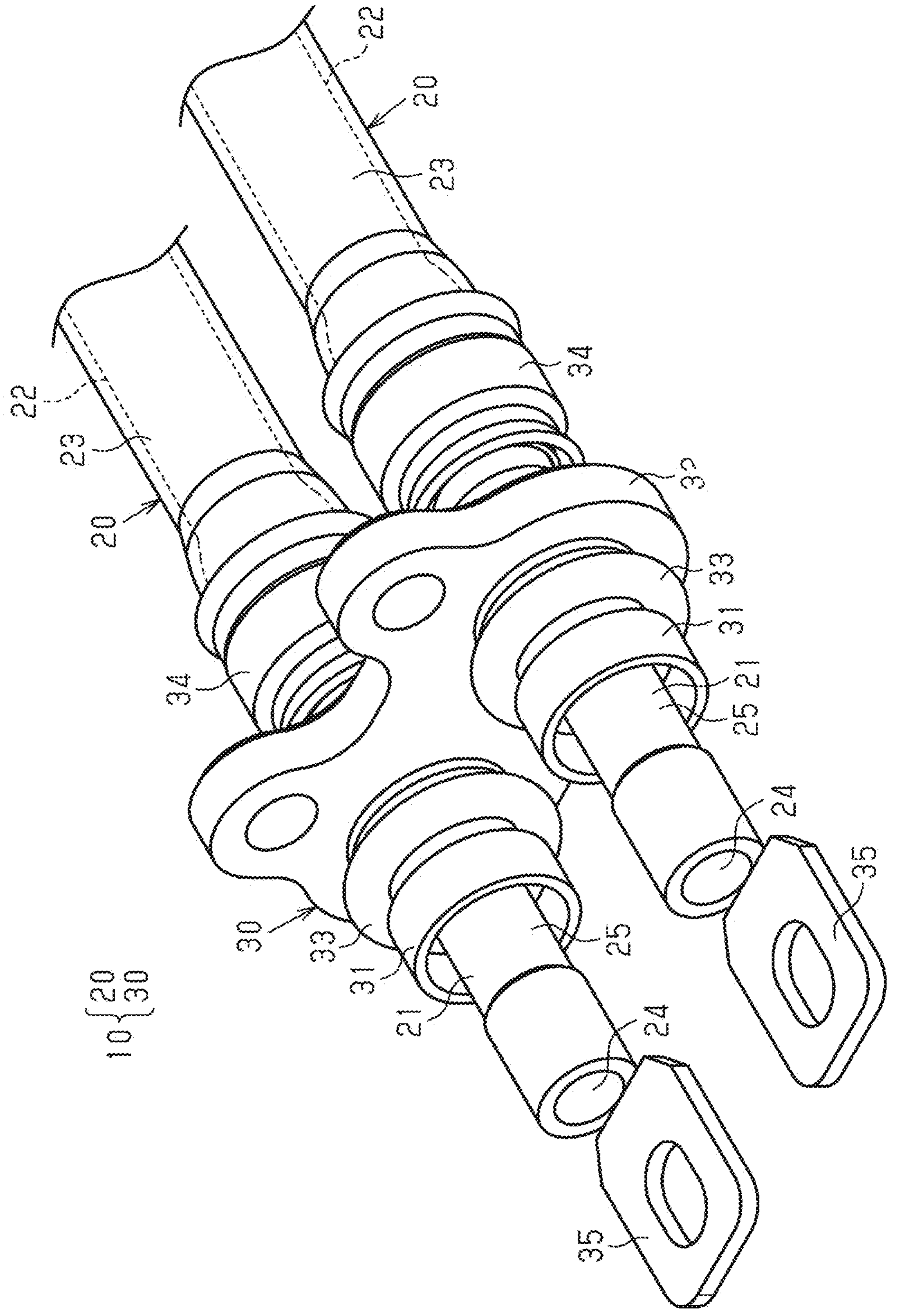
FIG. 1 is a partial perspective view of a wire harness according to an embodiment.

Firstly, modes for carrying out the present disclosure are listed and described.

A wire harness of the present disclosure is:

[1] a wire harness including: a shielded wire including: a core wire; an inner insulation coating covering an outer periphery of the core wire; a shielding member covering an outer periphery of the inner insulation coating; and an outer insulation coating covering an outer periphery of the shielding member; and a metal pipe through which the core wire and the inner insulation coating extend and to which the shielding member is connected, wherein the shielding member has a connection section connected to an outer circumferential face of the metal pipe while being covered by the outer insulation coating, and the outer insulation coating has an intimate contact section extending further from the connection section and in intimate contact over an entire perimeter with the outer circumferential face of the metal pipe.

With this configuration, the outer insulation coating can waterproof the connection section of the shielding member and the interior of the metal pipe. Specifically, the intimate contact section, which is a section of the outer insulation coating that extends further from the connection section, is in intimate contact with the outer circumferential face of the metal pipe, thereby preventing a liquid from entering the connection section side and the interior side of the metal pipe from the outside of the intimate contact section. This can simplify the configuration of the wire harness without the need for a rubber boot or the like.

[2] In the above configuration [1], it is preferable that the wire harness further includes a crimping member crimping and fixing the intimate contact section to the metal pipe.

With this configuration, the crimping member crimps and fixes the intimate contact section to the metal pipe. Thus, the intimate contact section can be brought into intimate contact with the metal pipe easily and firmly.

[3] In the above configuration [2], it is preferable that the crimping member has: a first crimping section crimping and fixing the intimate contact section to the metal pipe; and a second crimping member collectively crimping and fixing the connection section and the outer insulation coating to the metal pipe.

With this configuration, the first crimping section of the crimping member crimps and fixes the intimate contact section to the metal pipe. The second crimping section of the crimping member collectively crimps and fixes the connection section and the outer insulation coating to the metal pipe. This enables the connection section to be electrically connected to the metal pipe easily and firmly. Further, this can reduce the number of components compared to crimping and fixing them with the first and second crimping sections as separate members.

[4] In any one of the above configurations [1] to [3], it is preferable that the metal pipe constitutes a connector together with a metal fixing member that is fixed to the outer circumferential face of the metal pipe and is to be fixed to an attachment target.

This configuration can simplify the configuration of the wire harness having a connector. That is, the metal pipe and the metal fixing member are separately produced and fixed later to each other to make the connector, and each can thus be obtained easily. Further, the connector of the embodiment does not require a resin molded part such as a resin housing that is provided in conventional connectors, and does not require a mold for molding the resin molded part either. The connector of the embodiment can thus be produced easily.

[5] In the above configuration [4], it is preferable that the metal fixing member is made of a plate material.

This configuration allows the metal fixing member to be produced more easily than a casting.

[6] In the above configuration [4] or [5], it is preferable that the metal fixing member has a pipe fixing hole, and the metal pipe has an expanded section joined to an inner face of the pipe fixing hole.

With this configuration, the metal pipe can be joined to the inner face of the pipe fixing hole by expanding the metal pipe, thereby simplify fixing work compared to welding.

[7] In any one of the above configurations [4] to [6], it is preferable that the wire harness further includes a rubber ring fitted onto the metal pipe.

With this configuration, interposing the rubber ring between the outer circumferential face of the metal pipe and the attachment target can waterproof the area therearound.

[8] In the above configuration [7], it is preferable that the metal pipe has a narrowed section onto which the rubber ring is fitted.

This configuration prevents the rubber ring from shifting in the lengthwise direction of the metal pipe.

DETAILS OF EMBODIMENTS OF PRESENT DISCLOSURE

Specific examples of the wire harness of the present disclosure will be described below with reference to the drawings. The drawings may partially exaggerate or simplify configurations for convenience of description. The dimensional ratio of each part may differ between the drawings. The terms "parallel", "orthogonal", and "perfect circle" herein include not only cases of being strictly parallel, orthogonal, or a perfect circle but also cases of being substantially parallel, orthogonal, or a perfect circle in the range that exhibits the operation and effect of the present embodiment. Note that the present disclosure is not limited to these examples but is described by the claims, and is intended to include all modifications made within the meaning and scope equivalent to the claims.

Configuration of wire harness 10

A wire harness 10 includes shielded wires 20 and a connector 30, as shown in FIG. 1.

Configuration of Shielded Wire 20

Figure 2:
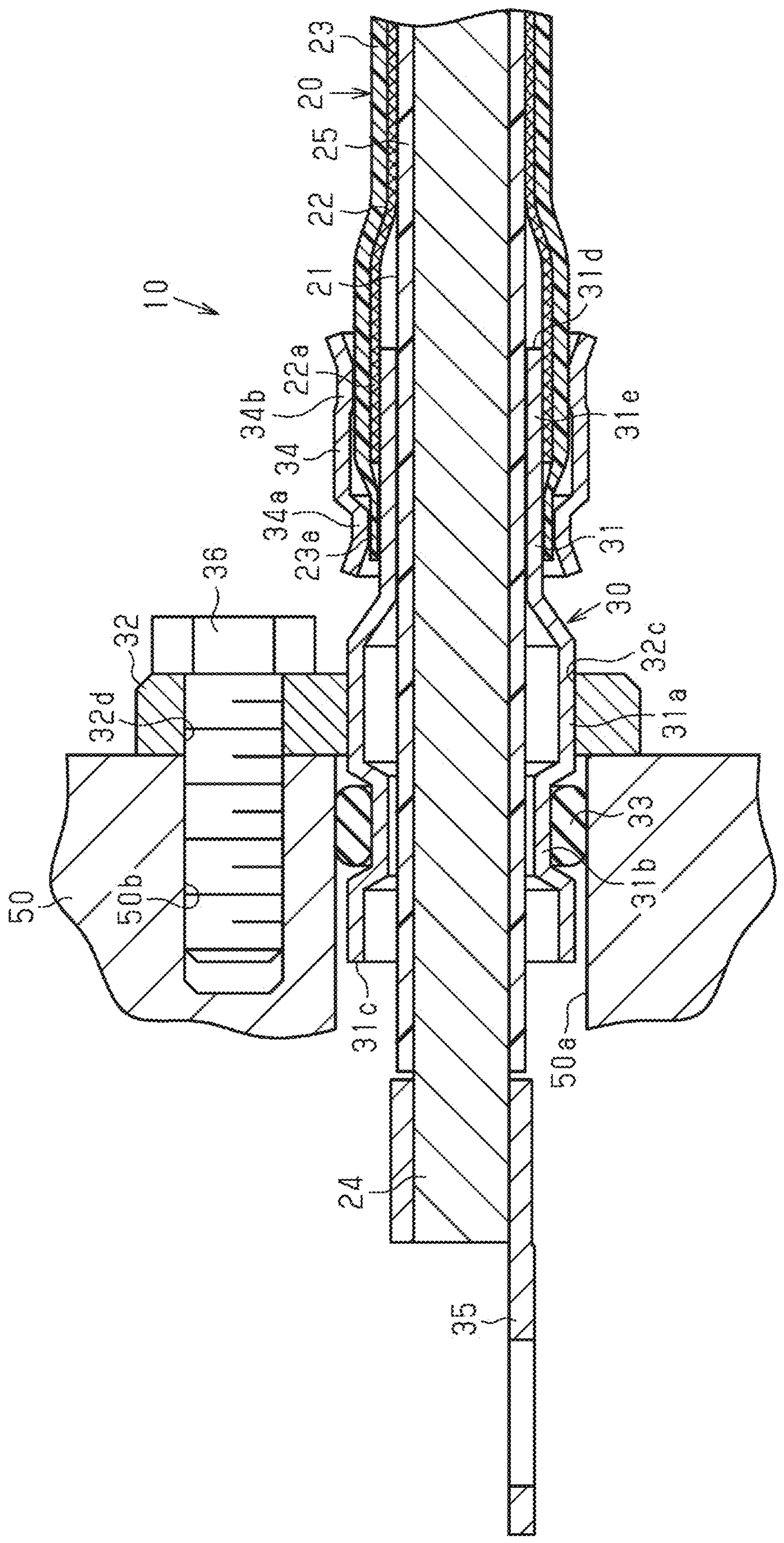
FIG. 2 is a cross-sectional view of a housing of an electrical device and the wire harness according to the embodiment.
Figure 3:
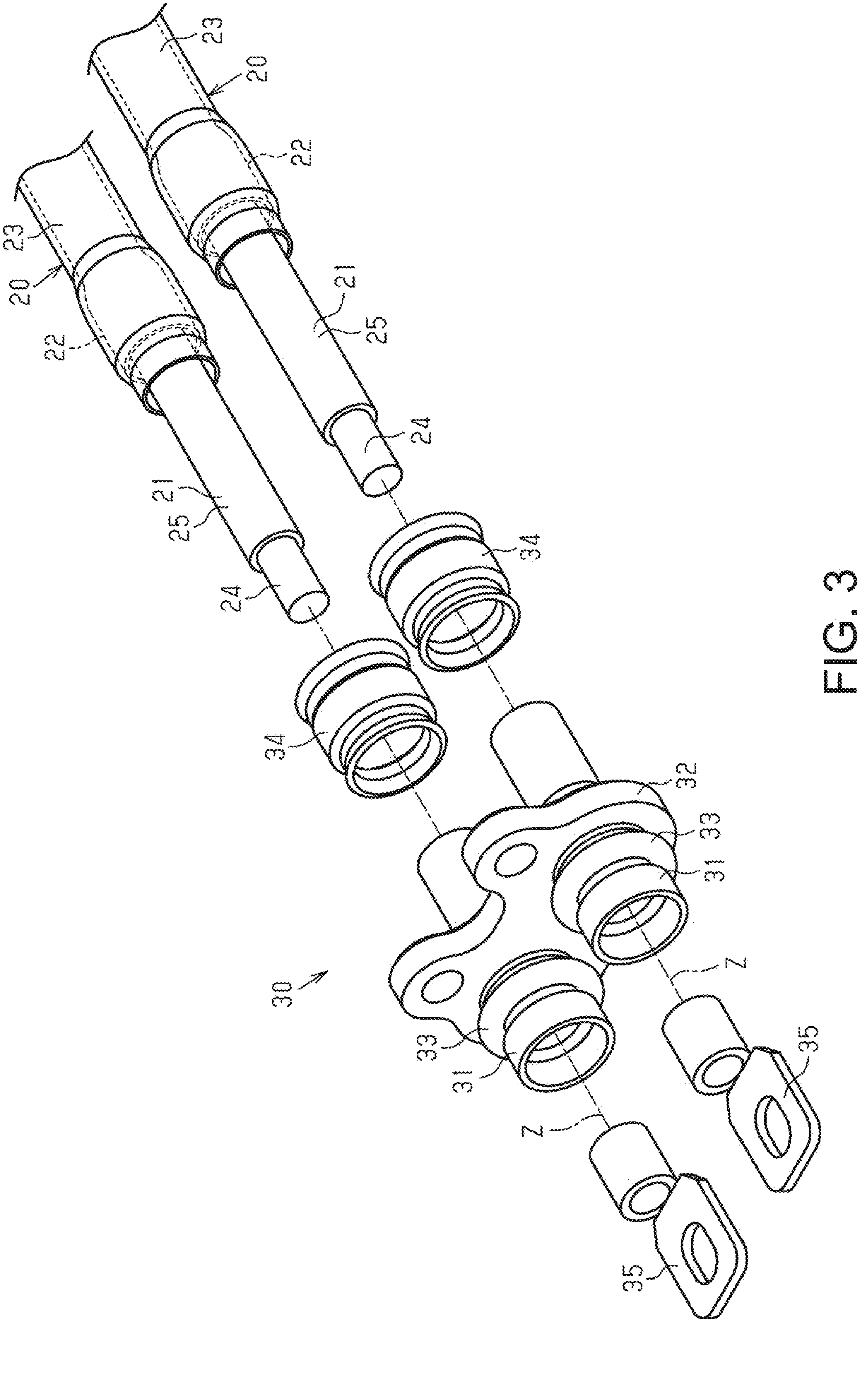
FIG. 3 is a partial exploded perspective view of the wire harness according to the embodiment.

Each shielded wire 20 is an individually shielded wire having an electric wire 21, a shielding member 22 (shield), and an outer insulation coating 23, as shown in FIGS. 1 to 3. The wire harness 10 of the present embodiment includes two shielded wires 20.

Each electric wire 21 has a core wire 24 and an inner insulation coating 25 that covers the outer periphery of the core wire 24. The core wire 24 of the present embodiment has a circular lateral cross section. The inner insulation coating 25 has an annular lateral cross section. The core wire 24 may be made of a conductive material such as metal.

The shielding member 22 covers the outer periphery of the inner insulation coating 25. The shielding member 22 is a braided wire obtained by braiding conductive elemental wires made of a copper alloy, aluminum alloy, or the like, in a tubular shape. Note that the shielding member 22 may have any other configuration, such as being made of a metal foil or the like, as long as electromagnetic radiation can be suppressed.

The outer insulation coating 23 covers the outer periphery of the shielding member 22. The outer insulation coating 23 has an annular lateral cross section. An end portion of the electric wires 21 protrudes to the outside from an end portion of the shielding member 22 and an end portion of the outer insulation coating 23.

Configuration of Connector 30

The connector 30 is fixed to the end portion of the shielded wire 20 and is also fixed to a housing 50 of an electrical device that serves as an attachment target, as shown in FIG. 2.

The connector 30 includes metal pipes 31 and a metal fixing member 32 fixed to outer circumferential faces of the metal pipes 31, as shown in FIGS. 1 to 4. The connector 30 of the present embodiment is compatible with two shielded wires 20 and has two metal pipes 31.

Configuration of Metal Fixing Member 32

The metal fixing member 32 is made of a plate material. Specifically, the metal fixing member 32 is made by, for example, punching a metal plate material.

Figure 4:
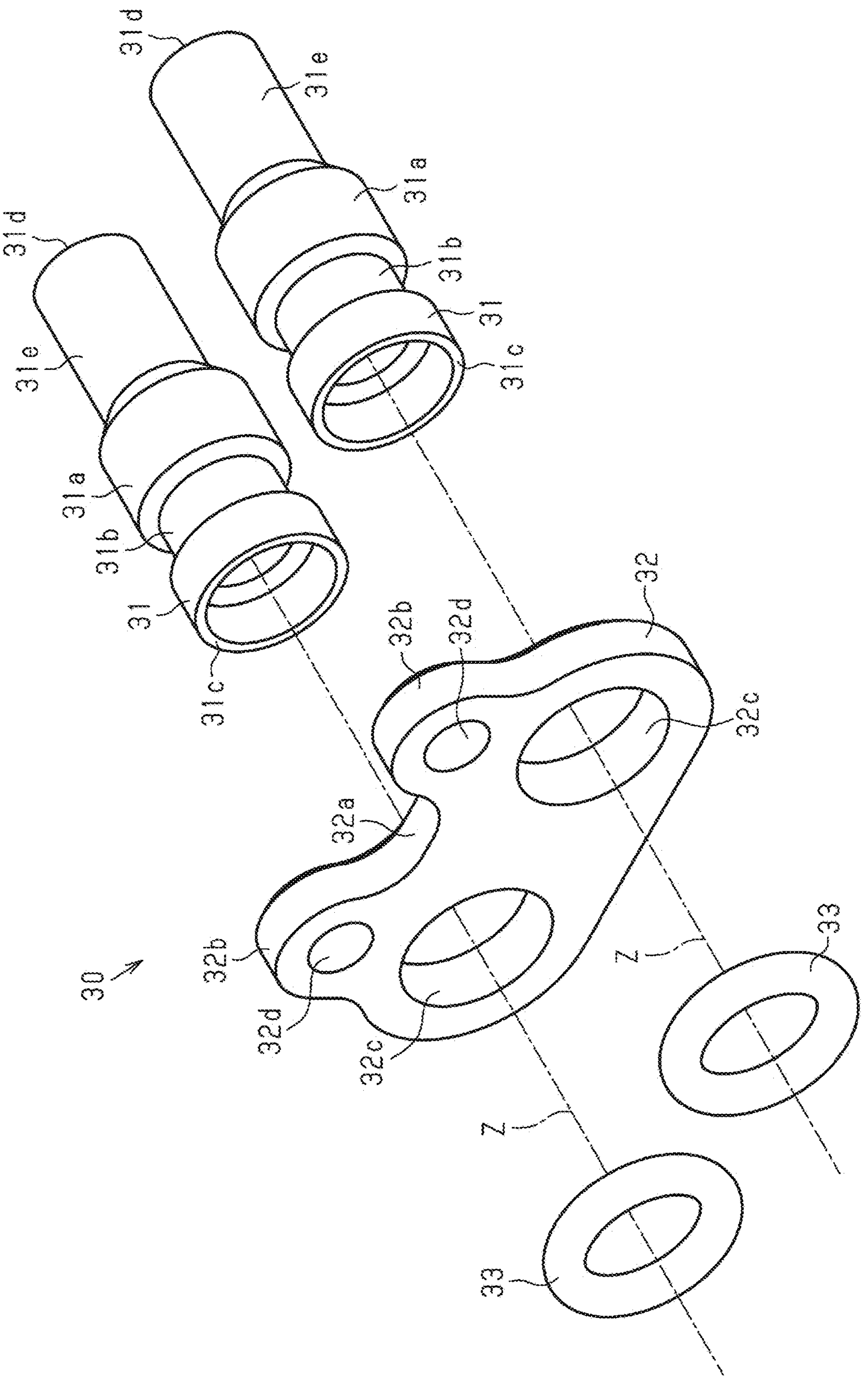
FIG. 4 is an exploded perspective view of a connector according to the embodiment.

The metal fixing member 32 has a main body **32*a* having a rectangular shape when viewed in the plate thickness direction, and fixing sections 32*b* protruding in the widthwise direction from the respective ends of the main body 32*a* in the lengthwise direction, as shown in FIG. 4. The metal fixing member 32 has pipe fixing holes 32*c* extending therethrough in the plate thickness direction. Two pipe fixing holes 32*c* are formed in the main body 32*a*. The two pipe fixing holes 32*c* are arranged in the lengthwise direction of the main body 32*a*. Note that the inner surfaces of the pipe fixing holes 32*c* are preferably subjected to uneven processing, such as knurling. The metal fixing member 32 also has connector attaching holes 32*d* extending therethrough in the plate thickness direction. One connector attaching hole 32*d* is formed in each of the two fixing sections 32*b***.

Configuration of Metal Pipe 31

Each metal pipe 31 is made of a pipe material. Specifically, the metal pipe 31 is made by subjecting a metal pipe material of a fixed diameter to expansion processing to increase the diameter or reduction processing to decrease the diameter.

As shown in FIG. 2, the metal pipe 31 has an expanded section **31*a*, which is joined to the inner face of the pipe fixing hole 32*c*. The expanded section 31*a* is a portion of the metal pipe 31 that has a larger diameter than adjacent portions in the lengthwise direction. The expanded section 31*a* is provided at an intermediate portion of the metal pipe 31. The metal pipe 31 is fixed to the metal fixing member 32 by pressing the expanded section 31*a* against the inner face of the pipe fixing hole 32*c* and joining the expanded section 31*a* thereto when the expanded section 31*a* is formed through expansion processing. In other words, the metal fixing member 32 is fixed to the metal pipe 31 by expanding the metal pipe 31 within the pipe fixing hole 32*c* to form the expanded section 31*a***.

As shown in FIGS. 3 and 4, the metal fixing member 32 is fixed to a plurality of metal pipes 31 such that axial lines Z of the metal pipes 31 are parallel to each other. Note that FIG. 4 is not an exploded perspective view of the metal pipes 31 and the metal fixing member 32 before being fixed to each other, but shows the metal pipes 31 each having the expanded section **31*a* that are once fixed to the metal fixing member 32** and then exploded again.

Each metal pipe 31 also has a narrowed section 31*b*. The narrowed section 31*b* is a portion of the metal pipe 31 that has a smaller diameter than adjacent portions in the lengthwise direction. The narrowed section 31*b* is provided closer to the leading end of the metal pipe 31 than the expanded section 31*a*. Specifically, the metal pipe 31 has a first end 31*c* located on the leading end side of the wire harness 10, and a second end 31*d* located on the intermediate side of the wire harness 10. The narrowed section 31*b* is located closer to the first end 31*c* than the expanded section 31*a*.

The connector 30 includes rubber rings 33 fitted onto the respective metal pipes 31. The rubber rings 33 are fitted onto the respective narrowed sections 31*b*.

Note that a portion of each metal pipe 31 between the expanded section 31*a* and the second end 31*d* is a base section 31*e* that is not subjected to expansion or reduction processing and maintains the original diameter of the pipe material constituting the metal pipe 31.

Fixing Structure of Shielded Wire 20 and Connector 30

As shown in FIG. 2, the electric wire 21 passes through the metal pipe 31. In other words, the core wire 24 and the inner insulation coating 25 extend through the metal pipe 31.

The shielding member 22 has a connection section 22*a*, which is covered by the outer insulation coating 23 and connected to the outer circumferential face of the metal pipe 31. Specifically, an end portion of the shielding member 22 in the extension direction serves as the connection section 22*a* that covers and is connected to the outer circumferential face of the metal pipe 31, while its outer periphery is covered by the outer insulation coating 23. The connection section 22*a* of the present embodiment is connected to the outer circumferential face of the base section 31*e* of the metal pipe 31.

The outer insulation coating 23 has an intimate contact section 23*a* that extends further from the connection section 22*a* and is in intimate contact over the entire perimeter with the outer circumferential face of the metal pipe 31. Specifically, an end portion of the outer insulation coating 23 in the extension direction serves as an intimate contact section 23*a* that extends further from the portion covering the connection section 22*a* and is in direct and intimate contact over the entire perimeter with the outer circumferential face of the metal pipe 31. The intimate contact section 23*a* of the present embodiment is in intimate contact with the outer circumferential face of the base section 31*e* of the metal pipe 31. Note that the shielded wire 20 is attached to the connector 30 by, for example, passing the electric wire 21 through the metal pipe 31 with the outer insulation coating 23 turned up, and then returning the outer insulation coating 23 to its original state. Of course, the shielded wire 20 may be attached to the connector 30 in any manner, e.g., by using a jig.

The wire harness 10 also includes a crimping member 34 (crimp) that crimps and fixes the intimate contact section 23*a* to the metal pipe 31. The crimping member 34 is an annular metal crimping ring.

As shown in FIG. 2, the crimping member 34 has a first crimping section 34*a* and a second crimping section 34*b*. The first crimping section 34*a* crimps and fixes the intimate contact section 23*a* to the metal pipe 31. In other words, the first crimping section 34*a* crimps and fixes the intimate contact section 23*a* using the metal pipe 31 as a base. The first crimping section 34*a* brings the intimate contact section 23*a* into intimate contact with the metal pipe 31 over the entire perimeter such that a liquid cannot enter the inside of the outer insulation coating 23.

The second crimping section 34*b* collectively crimps and fixes the connection section 22*a* and the outer insulation coating 23 to the metal pipe 31. In other words, the second crimping section 34*b* collectively crimps and fixes the connection section 22*a* and the outer insulation coating 23 using the metal pipe 31 as a base. The second crimping section 34*b* brings the connection section 22*a* into intimate contact with the metal pipe 31 such that the connection section 22*a* is connected to the metal pipe 31 in an electrically stable manner. Note that FIG. 3 is not an exploded perspective view of the crimping members 34 before being fixed to the connector 30, but shows the crimping members 34 and other parts that are once fixed to the connector 30 and then exploded again.

The end portion of each core wire 24 protrudes to the outside from the first end 31*c* of the metal pipe 31 and are exposed from the inner insulation coating 25. A terminal 35 is crimped and fixed to the end portion of the core wire 24.

Configuration of Housing 50 of Electrical Device and Fixing Structure of the connector 30

As shown in FIG. 2, the housing 50 of the electrical device as an attachment target includes an attaching hole 50*a* and a fastening section 50*b*. The housing 50 of the electrical device is made of metal. The connector 30 is fixed to the housing 50 of the electrical device such that the terminal 35 and the first end 31*c* side of the metal pipe 31 are inserted into the attaching hole 50*a*.

With the first end 31*c* side of the metal pipe 31 inserted into the attaching hole 50*a*, the rubber ring 33 is interposed in a compressed state between the outer circumferential face of the metal pipe 31 and the inner circumferential face of the attaching hole 50*a*. The connector 30 is fixed to the housing 50 of the electrical device by a bolt 36 that extends through the connector attaching hole 32*d* and threads into the fastening section 50*b*. The shielding member 22 is thus electrically connected to the housing 50 of the electrical device via the connector 30. With the connector 30 fixed to the housing 50 of the electrical device, a terminal (not shown) of the electrical device is connected to the terminal 35.

Next, the operation of the wire harness 10 having the above configuration is described.

The shielding member 22 of the shielded wire 20 covers the inner insulation coating 25 of the electric wire 21. This suppresses electromagnetic radiation from the core wire 24 in the area covered by the shielding member 22. The shielding member 22 is electrically connected to the housing 50 of the electrical device by fixing the connector 30 to the housing 50 of the electrical device. Further, the metal pipe 31 covers the electric wire 21 in the connector 30. This suppresses electromagnetic radiation from the core wire 24 in the area of the connector 30. The intimate contact section 23*a* at the end portion of the outer insulation coating 23 extends further in the extension direction from the portion covering the connection section 22*a* of the shielding member 22, and is in intimate contact over the entire perimeter with the outer circumferential face of the metal pipe 31. This makes it impossible for a liquid to enter the inside of the outer insulation coating 23, and waterproofs the interior of the connection section 22*a* and the metal pipe 31.

Next, the effect of the above embodiment is described below.

(1) The outer insulation coating 23 can waterproof the connection section 22*a* of the shielding member 22 and the interior of the metal pipe 31. Specifically, the intimate contact section 23*a*, which is a portion of the outer insulation coating 23 that extends further from the connection section 22*a*, is in intimate contact with the outer circumferential face of the metal pipe 31, thereby preventing a liquid from entering the connection section 22*a* side and the interior side of the metal pipe 31 from the outside of the intimate contact section 23*a*. This can simplify the configuration of the wire harness 10 without the need for a rubber boot or the like.

(2) The intimate contact section 23*a* of the outer insulation coating 23 is crimped and fixed to the metal pipe 31 using the crimping member 34. The intimate contact section 23*a* can thus be brought into intimate contact with the metal pipe 31 easily and firmly.

(3) The crimping member 34 has the first crimping section 34*a* and the second crimping section 34*b*. The first crimping section 34*a* crimps and fixes the intimate contact section 23*a* to the metal pipe 31. The second crimping section 34*b* collectively crimps and fixes the connection section 22*a* and the outer insulation coating 23 to the metal pipe 31. This enables the connection section 22*a* to be electrically connected to the metal pipe 31 easily and firmly. Further, this can reduce the number of components compared to crimping and fixing them with the first crimping section 34*a* and the second crimping section 34*b* as separate members.

(4) The metal pipe 31 constitutes the connector 30 together with the metal fixing member 32 fixed to the outer circumferential face of the metal pipe 31. This can simplify the configuration of the wire harness 10 having the connector 30. That is, the metal pipe 31 and the metal fixing member 32 are separately produced and fixed later to each other to make the connector 30, and each can thus be obtained easily. Further, the connector of the embodiment does not require a resin molded part such as a resin housing that is provided in conventional connectors, and does not require a mold for molding the resin molded part either. The connector 30 of the embodiment can thus be produced easily.

(5) The metal fixing member 32 is made of a plate material. Thus, the metal fixing member 32 can be produced more easily than, for example, a casting.

(6) The metal pipe 31 has the expanded section 31*a* joined to the inner face of the pipe fixing hole 32*c*, and can be joined to the inner face of the pipe fixing hole 32*c* by expanding the metal pipe 31. This makes fixing work easier than in, for example, welding.

(7) The rubber ring 33 is provided that is fitted onto the metal pipe 31. By interposing the rubber ring 33 between the outer circumferential face of the metal pipe 31 and the inner circumferential face of the attaching hole 50*a* in the housing 50 of the electrical device, this area can be waterproofed. The rubber ring 33 does not require a special shape and can be formed in a simple shape, and can be attached simply by fitting it onto the metal pipe 31. Thus, the connector 30 can be produced easily.

(8) The metal pipe 31 has the narrowed section 31*b* onto which the rubber ring 33 is fitted. This prevents the rubber ring 33 from shifting in the lengthwise direction of the metal pipe 31.

The present embodiment can be modified as follows when implemented. The above embodiment and the following modifications can be implemented in combination as long as no technical contradiction arises.

The intimate contact section 23*a* of the outer insulation coating 23 in the above embodiment is crimped and fixed to the metal pipe 31 by the crimping member 34. However, any other configuration may be employed as long as the intimate contact section 23*a* is in intimate contact with the outer circumferential face of the metal pipe 31. For example, the intimate contact section 23*a* may be brought into intimate contact with the outer circumferential face of the metal pipe 31 by a separate member other than the crimping member 34 or an adhesive, for example.

The crimping member 34 in the above embodiment has the first crimping section 34*a* and the second crimping section 34*b*, but there is no limitation to this. For example, the first crimping section 34*a* and the second crimping section 34*b* may be separate members. Further, the connection section 22*a* of the shielding member 22 and the outer insulation coating 23 are collectively crimped and fixed to the metal pipe 31 by the second crimping section 34*b*. However, any other configuration may be employed as long as they are connected to the outer circumferential face of the metal pipe 31.

The metal pipe 31 in the above embodiment constitutes the connector 30 together with the metal fixing member 32. However, there is not limitation to this, and the metal pipe 31 may have any other use. For example, the metal pipe 31 may be designed to regulate the route of the wire harness 10 passing under the floor of the vehicle. That is, a wire harness may be embodied that does not include the metal fixing member 32 and has the metal pipe 31 that is used as a route regulating member.

The metal fixing member 32 in the above embodiment is made of a plate material. However, there is no limitation to this, and may be, for example, a casting formed using a die. Further, the above-described metal fixing member 32 is made by punching a metal plate material, but it may alternatively be made of a plate material through any other processing, such as bending.

The metal pipe 31 in the above embodiment has the expanded section 31*a* that is joined to the inner face of the pipe fixing hole 32*c*. However, there is no limitation to this, and the expanded section 31*a* may be omitted. For example, the metal pipe may be fixed to the metal fixing member by means of welding.

The connector 30 in the above embodiment has the rubber ring 33 that is fitted onto the metal pipe 31. However, there is no limitation to this, and the rubber ring 33 may be omitted. Instead of the rubber ring 33, for example, a seal member may be fixed to the metal fixing member 32 using an adhesive or the like.

The metal pipe 31 in the above embodiment has the narrowed section 31*b* onto which the rubber ring 33 is fitted. However, there is no limitation to this, and the narrowed section 31*b* may be omitted.

The wire harness 10 in the above embodiment has two shielded wires 20, and the connector 30 has two metal pipes 31. However, there is no limitation to this, and the number of shielded wires 20 and the number of metal pipes 31 may be changed.

As shown in FIG. 2, the inner insulation coating 25 may be exposed from the outer insulation coating 23, and the shielding member 22 may be covered by the outer insulation coating 23, on the leading end side of the shielded wire 20 in the lengthwise direction. In the lengthwise direction of the shielded wire 20, the leading end of the inner insulation coating 25 may extend further to the leading end side than the leading end of the outer insulation coating 23, and the leading end of the outer insulation coating 23 may extend further to the leading end side than the leading end of the shielding member 22.

As shown in FIG. 2, a portion of the shielded wire 20 in the lengthwise direction may be covered by the metal pipe 31. The second end 31*d* of the metal pipe 31 may be sandwiched in the radial direction between the shielding member 22 and the inner insulation coating 25. The outer insulation coating 23 may be in intimate contact over the entire perimeter with the outer circumferential face of the metal pipe 31 while covering the shielding member 22.

The invention claimed is:

1. A wire harness comprising:
a shielded wire including:
a core wire;
an inner insulation coating that covers an outer periphery of the core wire;
a shield that covers an outer periphery of the inner insulation coating; and
an outer insulation coating that covers an outer periphery of the shield; and
a metal pipe through which the core wire and the inner insulation coating extend and to which the shield is connected, wherein:
the shield has a connection section connected to an outer circumferential face of the metal pipe while being covered by the outer insulation coating, and
the outer insulation coating has an intimate contact section that extends further from the connection section and in intimate contact over an entire perimeter with the outer circumferential face of the metal pipe.

2. The wire harness according to claim 1, further comprising:

a crimp that crimps and fixes the intimate contact section to the metal pipe.

3. The wire harness according to claim 2,
wherein the crimp has:
a first crimping section that crimps and fixes the intimate contact section to the metal pipe; and
a second crimping section that collectively crimps and fixes the connection section and the outer insulation coating to the metal pipe.

4. The wire harness according to claim 1,
wherein the metal pipe constitutes a connector together with a metal fixing member that is fixed to the outer circumferential face of the metal pipe and is to be fixed to an attachment target.

5. The wire harness according to claim 4,
wherein the metal fixing member is made of a plate material.

6. The wire harness according to claim 4, wherein:
the metal fixing member has a pipe fixing hole, and
the metal pipe has an expanded section joined to an inner face of the pipe fixing hole.

7. The wire harness according to claim 4, further comprising:
a rubber ring fitted onto the metal pipe.

8. The wire harness according to claim 7,
wherein the metal pipe has a narrowed section onto which the rubber ring is fitted.

* * * * *